United States Patent [19]

Mason et al.

[11] Patent Number: 5,007,844

[45] Date of Patent: Apr. 16, 1991

[54] SURFACE MOUNT METHOD AND DEVICE

[75] Inventors: Scott C. Mason, Fort Collins; Robert A. Slutz, Loveland, both of Colo.

[73] Assignee: Hewlett-Packard Company, Palo Alto, Calif.

[21] Appl. No.: 466,169

[22] Filed: Jan. 17, 1990

[51] Int. Cl.⁵ ............................................. H01R 9/09
[52] U.S. Cl. ...................................... 439/68; 439/83; 439/70
[58] Field of Search ............................ 439/68, 70–73, 439/83, 525, 526, 873

[56] References Cited

U.S. PATENT DOCUMENTS 4,558,397 12/1985 Olsson .................................. 439/69
4,645,279 2/1987 Grabbe et al. ...................... 430/68

FOREIGN PATENT DOCUMENTS 2312915 12/1976 France ................................ 439/68

Primary Examiner—Paula A. Bradley

[57] ABSTRACT

Method and device are provided for use in the initial manufacture of surface mount printed circuit board assemblies or for use in the replacement and repair of J-leads surface mount electrical components on printed circuit boards.

23 Claims, 3 Drawing Sheets

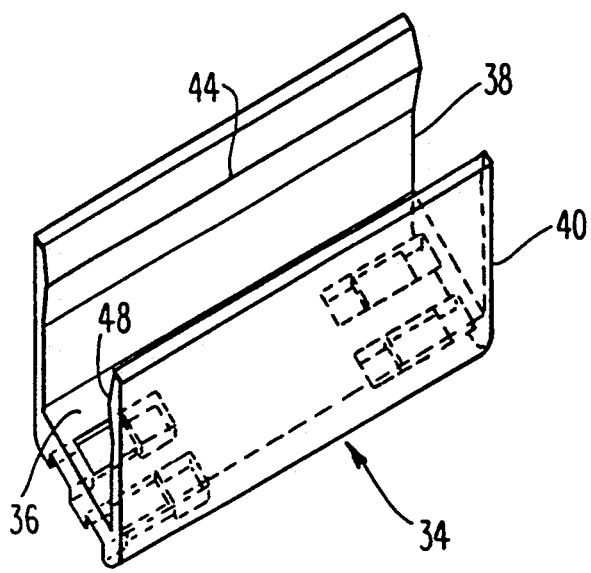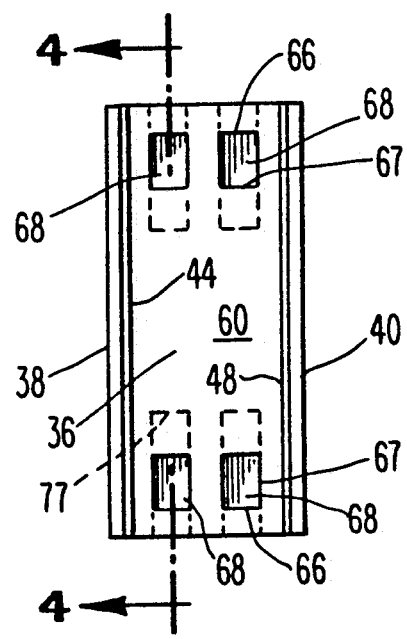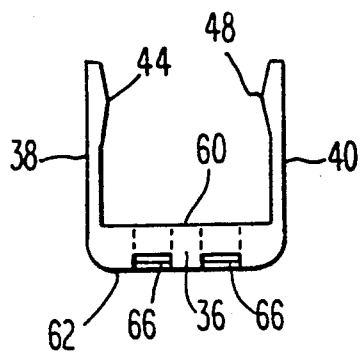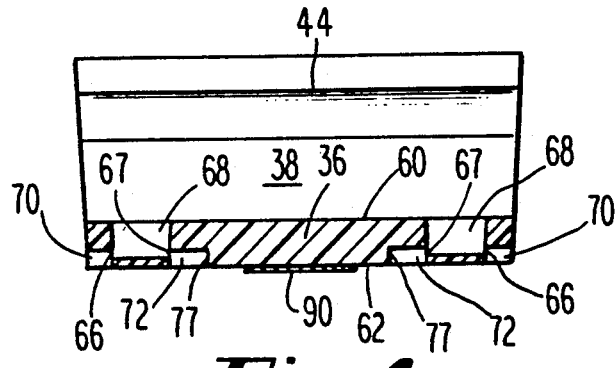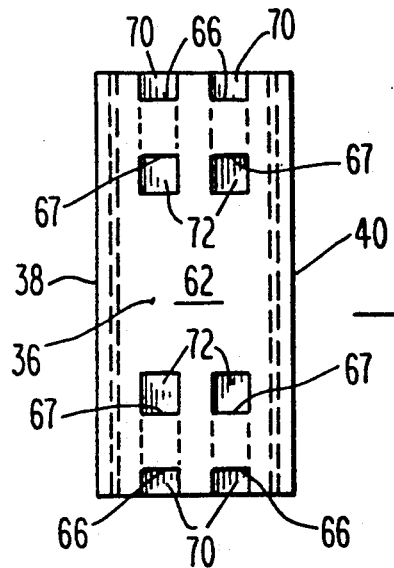
Fig. 2
Fig. 3
Fig. 5
Fig. 4
Fig. 6

SURFACE MOUNT METHOD AND DEVICE

FIELD OF THE INVENTION

The present invention relates generally to surface mount electrical component/printed circuit board methods and devices and, more particularly, to methods and devices for use in the initial manufacture of surface mount printed circuit board assemblies or for use in the replacement and repair of J-lead surface mount electrical components on printed circuit boards.

BACKGROUND OF THE INVENTION

Various techniques for mounting electrical components on printed circuit boards are known in the art. One such technique involves the insertion of the lead ends of the electrical components through plated openings to the opposite surface of the printed circuit boards and, thereafter, soldering the inserted ends to secure the electrical component to the board and make the required electrical connections.

Another technique, so-called surface mount technology (SMT), involves electrical components that are mounted directly onto the surface of the printed circuit board without leads penetrating to the opposite side of the printed circuit board. More specifically, in a typical surface mount process, the printed circuit board has printed on the surface thereof circuit traces and contact/mountings or conductive "pads". A surface mount electrical component having a plurality of leads is placed on the pads. Sometimes an adhesive is used to hold the surface mount component in position on the circuit board. Solder may have been applied to either the plurality of leads of the electrical component or the pads prior to placement of the electrical component on the pads. When all components are in place on the printed circuit board, heat energy is applied to solder and effect electrical and mechanical connections between the leads of the electrical components and the pads and traces of the printed circuit board.

There are various types of surface mounted electrical components and various types of lead structures thereof. The present invention is directed to surface mount electrical components which have inwardly extending J-shaped leads and to the replacement and repair of such J-lead surface mount electrical components. The present invention also has application to initial manufacturing of a SMT type printed circuit board, i.e., the initial loading of the electrical components on the SMT printed circuit board.

Existing procedures for repairing and replacing J-lead SMT electrical components involve removing the failed electrical component and soldering a new electrical component onto the printed circuit board. In practice, such repair or replacement presents several difficulties. One of such difficulties relates to the need to precisely locate the electrical component's J-leads over the contact/mounting pads on the printed circuit board to insure reliable solder joints. Maintaining the electrical component's position over the pads is important to insure that the component's J-leads do not move off of the pads prior to and during the soldering operation. Still another difficulty relates to the nature of the design of SMT J-leads. The solder joints at the J-leads are located under the electrical component body and thus are at least partially obscured from access and sight during soldering operations. This last difficulty is exacerbated on densely populated printed circuit boards.

SMT replacement systems currently available include expensive and complex equipment to meet the difficulties described above. The use of these complex systems usually requires the service technician in the field repairing an SMT printed circuit board to return the printed circuit board to the factory or to a service center for SMT electrical component repair or replacement.

Accordingly, there is a need for a simple, but reliable, and inexpensive technique for accurately locating the J-leads of SMT electrical components and for soldering the J-leads to the printed circuit board, either during initial manufacture of a SMT type printed circuit board or when servicing SMT printed circuit boards in the field.

SUMMARY OF THE INVENTION

It is a primary object of the present invention to provide methods and devices in response to, and in satisfaction of, the aforementioned need experienced in actual practice.

This and other objects are achieved in accordance with one aspect of the present invention by the method of effecting electrical and mechanical connections between a J-lead surface mount electrical component and conductive pads on a printed circuit board comprising the steps of:

placing a socket means having a plurality of contact elements mounted thereon on the printed circuit board;

soldering the plurality of contact elements to conductive pads on the printed circuit board;

inserting a J-lead surface mount electrical component having a plurality of J-shaped leads into the socket means; and soldering the plurality of contact elements to the J-shaped leads.

In another aspect, the present invention comprises a device for effecting electrical and mechanical connections between a surface mount electrical component and conductive pads on a printed circuit board comprising:

socket means for receiving a surface mount electrical component, the component comprising a body member and a plurality of J-shaped leads; and a plurality of contact elements mounted on the socket means, each of the contact elements having a first portion for soldering the contact element to a conductive pad on a printed circuit board and a second portion for soldering the contact element of a J-shaped lead of the electrical component.

In a particular embodiment of the invention, the socket means comprises a generally elongate U-shaped member having a transverse portion for placement adjacent to the surface of the printed circuit board and two substantially parallel wall portions extending therefrom. The plurality of contact elements are mounted on the transverse portion of the U-shaped member.

The foregoing and other objects, features and advantages of the invention will become more apparent from the following description thereof with reference to the accompanying drawings.

BRIEF DESCRIPTION OF THE DRAWINGS

In the accompanying drawings:

FIG. 2 is a perspective view of the socket means in accordance with the invention;

FIG. 3 is a top plan view of the socket means shown in FIG. 2;

FIG. 4 is a sectional view taken along the line 4—4 of FIG. 3;

FIG. 5 is an end view of the socket means shown in FIG. 2;

FIG. 6 is a bottom view of the socket means shown in FIG. 2;

DETAILED DESCRIPTION OF THE PREFERRED EMBODIMENTS

The present method and device comprising this invention may be practiced in many different ways. It will be understood by those of ordinary skill in the art that the present invention is with respect to an example of the present invention and should not be construed as a limitation on the materials or methods described. In FIGS. 1-8 the representation of the device in accordance with the invention is illustrated as adapted for use with a J-lead surface mount electrical component having two J-leads on each of its ends by way of example. In practice, of course, the J-lead surface mount electrical component may comprise an electrical component having more than two J-leads on each of its ends and may have J-leads along its sides as well. The construction of the device in accordance with the invention may then be modified accordingly, in a manner that will become apparent as the description proceeds.

Figure 1:
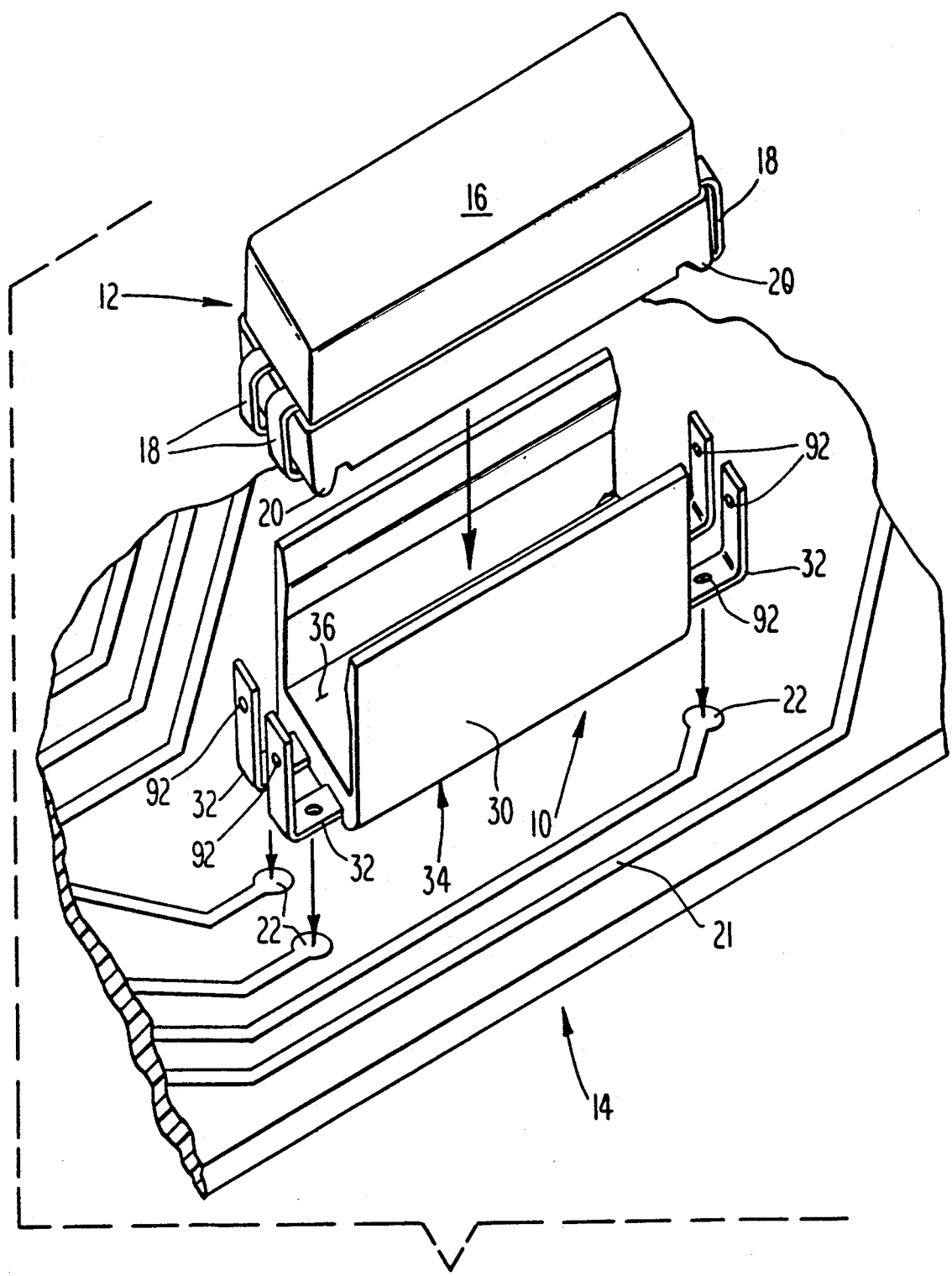
FIG. 1 is an exploded perspective view of the device in accordance with the invention shown in conjunction with a printed circuit board and a J-lead surface mount electrical component exploded therefrom.

Referring now to the drawings wherein like reference numerals refer to like parts throughout the several views, and in particular to FIG. 1, a device embodying the present invention is generally identified therein by the numeral 10. A surface mount electrical component is shown generally at 12 and a substrate or printed circuit board is shown generally at 14.

The surface mount electrical component 12 illustrated is an electrical relay, however, it may comprise any surface mount integrated circuit package adapted to be directly solder connected to the printed circuit board 14. Typically, such integrated circuit packages comprise a body member or plastic housing 16 with a plurality of J-shaped leads or legs 18 extending inwardly in curved fashion therefrom. Each of the curved conductive legs 18 are supported by integral supports 20 formed integral with the body member 16. The supports 20 ar in contact with the J-leads to prevent the legs from being distorted by pressure placed upon the body member 16.

Referring now to the substrate or printed circuit board 14, a circuit pattern 21 and a plurality of contact or spaced conductive pads 22 are formed thereon using a conventional printed circuit process. The surface mount electrical component is typically installed on the printed circuit board 14 using reflow soldering, vapor phase solder or the like which thereby mechanically and electrically effects a connection between the legs 18 of the surface mount component 12 and the conductive pads 22 on the printed circuit board 14.

In the event that a surface mount electrical component so mounted to a printed circuit board fails, it can be removed by heat applied by a hand-held hot air blower to melt the solder or by the use of specially constructed tweezer like soldering irons which melt the solder. The repair person, upon melting of the solder holding the J-lead component to the printed circuit board, then removes the component. A new component or replacement can be added to the printed circuit board, by placing the J-leads of a new or replacement component, which have a solder paste applied thereto, on the pads and thereafter, by the application of heat energy cause the solder paste to liquify. Removal of the heat source causes the solder to solidify thereby effecting the electrical and mechanical connection between the surface mount component and the conductive pads on the printed circuit board.

It can be seen that such procedures require a significant amount of manual dexterity especially since the solder joints at the J-leads are located under the electrical component body member and are, therefore, partially obscured from access and sight. The device 10, in accordance with the present invention, makes the repair or replacement of J-lead components relatively simple.

Referring again to FIG. 1, the device 10, in accordance with the invention, is for effecting electrical and mechanical connections between a surface mount electrical component such as that shown generally at 12 and the conductive pads 22 on the printed circuit board shown generally at 14. The device 10 comprises a socket means 30 for receiving the surface mount electrical component 12 and a plurality of contact elements 32 mounted on the socket means 30. In practice, there would be one contact element 32 for each of the J-leads of the surface mount electrical component.

Referring now more particularly to FIGS. 2-6, the socket means 30 comprises a generally elongate U-shaped member 34 having a transverse portion 36 for placement adjacent to the surface of the printed circuit board 14; two substantially parallel wall portions 38 and 40 extending therefrom; and the contact elements 32. The wall portions 38, 40 have respective distal shoulder portions 44 and 48 having a larger cross section than the rest of the wall portions for cooperating with peripheral portions of the body member 16 of the surface mount component to provide an interference fit between the body member 16 and the U-shaped member 34 such that the body member 16 snaps into place when the body member 16 is placed or inserted into the socket means 30. As used herein the term "interference fit" means that no fastening elements are used to connect the various parts; instead, the dimensions of the parts and the inherent elasticity of the materials are utilized to obtain the connection. Such interference fits typically secure a certain amount of tightness between parts that are meant to remain assembled.

Figure 7:
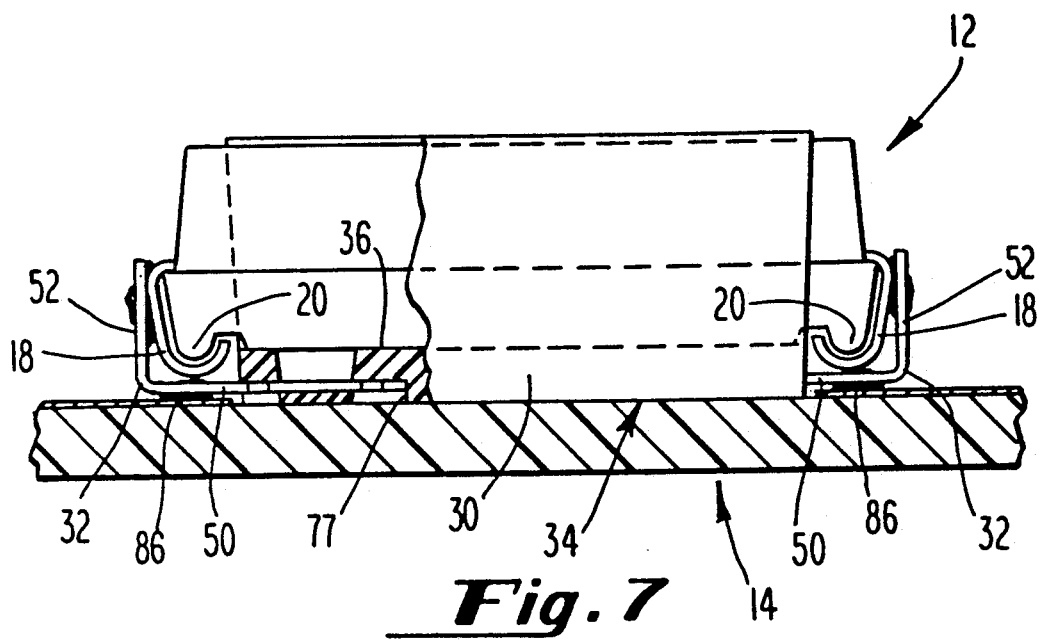
FIG. 7 is a front view of the device in accordance with the invention shown in FIG. 1 but in assembled form.
Figure 8:
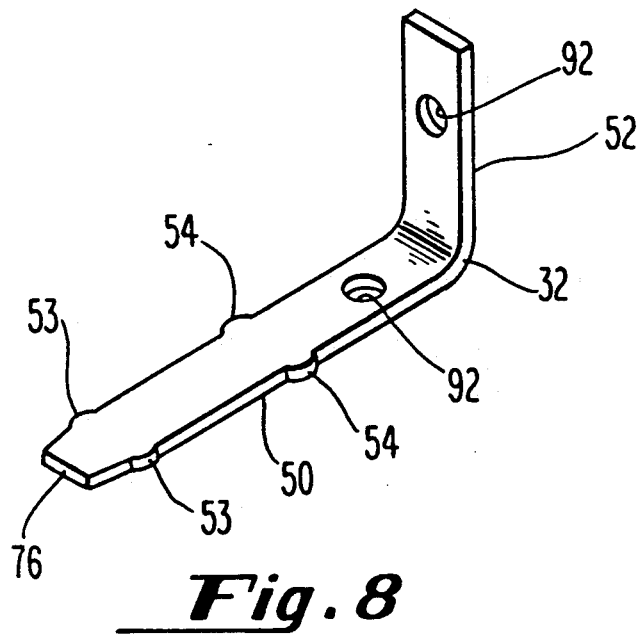
FIG. 8 is a perspective view of a contact element of the device in accordance with the invention shown in FIG. 1.

As illustrated in FIGS. 1 and 7, each of the contact elements 32 are mounted on the transverse portion 36 of the U-shaped member 34 and each have a first portion 50 for soldering the contact element 32 to the conductive pad 22 on the printed circuit board 14 and a second portion 52 for soldering the contact element 32 to a J-shaped lead of the electrical component 12. As best seen in FIG. 8, the first portions 50 of contact elements 32 have first and second protrusion means 53 and 54 thereon, i.e. the width of the first portions 50 at the protrusion means 53, 54 being wider than the other portions of the first portions 50. The purpose of these protrusions 53, 54 will be explained more fully hereinafter.

The transverse portion 36 of the U-shaped member 34 includes an upper surface 60 against which the electrical component 12 abuts when it is inserted into the socket means 30 and a lower board mounting surface 62. A first and second plurality of slit means 66 and 67, respectively, are disposed between the upper surface 60 and lower surface 62. As best seen in FIG. 3, a plurality of recesses 68 are provided in the upper surface 60 of the transverse portion 36. As best seen in FIG. 6, a first plurality of recesses 70 are provided in board mounting surface 62 along the forward and rearward edges of the socket means 30 and a second plurality of recesses 72 are provided in board mounting surface 62 which are spaced from the recesses 70 inwardly toward the center of the socket means 30. Each one of the slit means 66 open into one of the recesses 68 provided in upper surface 60 and each one of the slit means 67 open into one of the recesses 72 provided in the bottom surface 62. The arrangement is such that upon insertion of a first portion 50 into a recess 70 and then into a slit means 66, the first protrusion means 53 having a width wider than the slit means 60 interfere with the sides of the slit means 66 as the first protrusion means 53 passes through slit means 66 and thereafter, snap into place when protrusion means 53 enter into a recess 68 in the upper surface 60. As the first protrusion means 53 passes through the recess 68 and enters a slit 67, the protrusion means 53 interfere with the sides of the slit 67 as the protrusion means 53 passes through the slit means 67 and, thereafter snap into place when protrusion means 53 enter into a recess 72 in the lower surface 62. When the first portion 50 is advanced fully into place, the forward end 76 of the first portion 50 will be located against the rear wall 77 of a recess 72 provided in lower surface 62. The spacing between the protrusion means 53 and 54 is such that as protrusion means 53 begins to enter a slit 67, protrusion means 54 begins to enter a slit 66 and, when protrusion means 53 snap into place in a recess 72, the protrusion means 54 snap into place in a recess 68.

From the foregoing, it will be understood that an interference fit is effected between the U-shaped member 34 and the contact elements 32. It will be also understood that the transverse portion 36 and the first portions 50 of the contact elements 32 have coengageable means (i.e., the protrusion means, the slit means and the recesses provided in the top and bottom surfaces of the transverse portion 36) integral therewith for securing the first portions 50 of the contact elements 32 to the transverse portion 36 of the U-shaped member 34.

With reference now to FIG. 7, it can be seen that with the contact elements 32 in place, the first portions 50 of the contact elements 32 generally lie in a plane substantially parallel to the transverse portion 36 and each of the second portions of the contact elements 32 generally lie in a plane substantially normal to the transverse portion 36 of the U-shaped member 34. More specifically, the first portions 50 of the contact elements 32 lie in a plane disposed between and parallel to the planes in which the upper and lower surfaces 60 and 62 of the transverse portion 36 lie. With this arrangement, the first portions 50 of the contact elements 32 are disposed in proximity to and above the conductive pads 22 on the printed circuit board 14 when the socket means 10 is placed on the printed circuit board 14 to provide space for solder 86 to flow between the first portions 50 of the contact elements 32 and the conductive pads 22.

Also, as can best be seen in FIG. 7, each of the J-leads 18 of the J-lead electrical component, i.e., the vertical leg portion of the J-lead, is soldered to the second portion 52 of a contact element 32 in a surface mount electrical component assembly comprised of a printed circuit board 14, a socket means 10 having the contact elements 32 mounted thereon and a surface mount J-lead electrical component 12 positioned in the socket means 10. Also shown in FIG. 4 generally at 90 in exaggerated form is an adhesive or double sided tape which can be used to secure the device 10 to the printed circuit board 14 prior to soldering the first portions 50 of the contact elements 32 to the conductive pads 22. In addition, openings 92 are provided in the contact elements to facilitate soldering and permit solder to flow during soldering operations.

From the foregoing it will be understood that in order to repair or replace a J-lead surface mount electrical component or a surface mount printed circuit board in accordance with the invention, the service person would remove the surface mount component by the application of heat energy such that the solder on the J-leads melts. A socket means 30 with contact elements 32 would then be placed on the printed circuit board 14 with first portions 50 of the contact elements overlying the conductive pads 22 in spaced relationship to them. The first portions 50 would then be soldered to the conductive pads 22. The replacement surface mount electrical component would then be inserted into the socket means 10. Finally, the vertical leg portions of each of the J-shaped leads would be soldered to the second portions 50 of the contact elements 32. It will be readily be understood that at each step of the replacement, the service person has excellent visibility to the solder joint for inspection.

In a preferred embodiment of the device 10, the socket means 30, i.e., the U-shaped member 34 is fabricated of an insulating material as, for example, a molded, resilient plastic such as OF-1008 Thermocomp brand manufactured by LNP Corp., or 3601G030 Thermocomp brand, RF-10006 Thermocomp brand or D-150GL30 Thermocomp brand, all of which are also manufactured by LNP Corp. The contact elements 32 are preferably manufactured of a beryllium copper sheet by a chemical etching process. The contact elements 32 are preferably plated with a composition of 63% tin, 37% lead solder.

While there has been illustrated and described a particular embodiment of the present invention, it will be appreciated that numerous charges and modifications will occur to those skilled in the art, and it is intended in the appended claims to cover all those charges and modifications which fall within the true spirit and scope of the present invention.

We claim:

1. A device for effecting electrical and mechanical connections between a surface mount electrical component and conductive pads on a printed circuit board, said device comprising:

socket means for receiving a surface mount electrical component, said component comprising a body member and a plurality of J-shaped leads; and a plurality of contact elements mounted on said socket means, each of said contact elements having a first portion for soldering the contact element to a conductive pad on a printed circuit board and a second portion for soldering said contact element to a J-shaped lead of said electrical component, said first portion extending away from said socket means, and said second portion being at a distal end of the first portion to define an intermediate portion between the socket means and the second portion that overlays the conductive pad when said socket means is positioned on said printed circuit board, said intermediate portion providing an access space for soldering said contact element to said conductive pad and for visually inspecting a resulting solder joint.

2. A device according to claim 1 wherein the said socket means retains said component therein but exposes locations where said J-shaped leads are to be soldered to said second portions of said contact elements for providing access for soldering said second portions to said J-shaped leads and for visually inspecting a resulting solder joint.

3. A device according to claim 1 wherein said socket means comprises a generally elongate U-shaped member having a transverse portion for placement adjacent to the surface of said printed circuit board and two substantially parallel wall portions extending therefrom.

4. A device according to claim 3 wherein said wall portions have respective distal shoulder portions having a larger cross section than the rest of the wall portion for cooperating with peripheral portions of said body member of said component to provide an interference fit between said body member of said component and said U-shaped member such that said body member snaps into place when said body member is inserted into said socket means.

5. A device according to claim 3 wherein said plurality of contact elements are mounted on said transverse portion of said U-shaped member.

6. A device according to claim 5 wherein said first portions of said contact elements lie in a plane substantially parallel to said transverse portion of said U-shaped member and each of said second portions of said contact elements lie in a plane substantially normal to said transverse portion of said U-shaped member.

7. A device according to claim 5 wherein said transverse portion includes adhesive means for securing said U-shaped member to a printed circuit board.

8. A device according to claim 5 wherein said said plurality of contact elements comprise one contact element for each of the J-leads on said electrical component.

9. A device according to claim 5 wherein said transverse portion of said U-shaped member and said first portions of said contact elements have coengageable means integral therewith for securing said first portions of said contact elements to said transverse portion.

10. A device according to claim 9 wherein said transverse portion includes an upper surface against which said electrical component abuts when it is inserted into said socket means and a lower board mounting surface, and said coengageable means comprises:
   protrusion means on said first portions of said contact elements;
   a plurality of slit means disposed between said upper and lower surfaces; and
   a plurality of recesses provided in the upper and lower surfaces of said transverse portion, said slit means opening into said recesses, whereby, upon insertion of said first portions of said contact elements into said slit means, said protrusion means interfere with the sides of the slit means as said protrusion means passes through said slit means and, thereafter, snap into place when said protrusion means enter into said recesses.

11. A device according to claim 10 wherein said first portions of said contact elements lie in a plane disposed between and parallel to the planes in which the upper and lower surfaces of said transverse portion lie.

12. A surface mount electrical component assembly comprising:
   a substrate having a mounting surface and having a circuit pattern formed on such mounting surface, said circuit pattern including spaced conductive pads;
   at least one socket means for receiving a surface mount electrical component;
   an electrical component positioned in said socket means, said component comprising a body member and a plurality of J-shaped leads; and
   a plurality of contact elements mounted on said socket means, said contact elements comprising one contact element for each J-shaped lead of said electrical component, each of said contact elements having a first portion soldered to one of said conductive pads and a second portion soldered to one of said J-leads of said electrical component, said first portion extending away from said socket means, and said second portion being at a distal end of said first portion to define an intermediate portion between the socket means and the second portion that overlays the conductive pad, each said first portion being soldered to said conductive pad at said intermediate portion, said intermediate portion providing a visual access space for inspecting a solder joint before said electrical component is positioned in said socket.

13. A surface mount electrical component assembly according to claim 12 wherein said socket means comprises a generally elongate U-shaped member having a transverse portion and two substantially parallel wall portions extending therefrom.

14. A surface mount electrical component assembly according to claim 13 wherein said transverse portion includes an upper surface against which the bottom surface of said electrical component abuts and a lower board mounting surface.

15. A surface mount electrical component assembly according to claim 14 wherein said plurality of contact elements are mounted on said transverse portion.

16. A surface mount electrical component assembly according to claim 15 wherein said transverse portion and said first portions of said contact elements have coengageable means integral therewith for securing said transverse portion and said first portions to each other.

17. A surface mount electrical component assembly according to claim 16 wherein said coengageable means comprises:
   a protrusion means on said first portions of said contact elements;
   a plurality of slit means disposed between said upper and lower surfaces of said transverse portion; and
   a plurality of recesses provided in the upper and lower surfaces of said transverse portion, said slit means opening into said recesses, said first portions of said contact elements passing through said slit means with said protrusion means being disposed in said recesses, the width of said first portions at said protrusion means being wider than the width of said slit means.

18. A surface mount electrical component assembly according to claim 17 said wall portions have shoulder portions adjacent their distal ends having a larger cross section than the rest of the wall portions, said shoulder portions cooperating with peripheral portions of said body member of said electrical component to provide an interference fit between said body member and said U-shaped member such that said body member snaps into place when said body member is inserted into said U-shaped member.

19. A method for effecting electrical and mechanical connections between a J-lead surface mount electrical component and conductive pads on a printed circuit board comprising the steps of:
 (a) placing a socket means having a plurality of contact elements mounted thereon on a printed circuit board;
 (b) soldering said plurality of contact elements to conductive pads on said printed circuit board, each said contact element having a first portion that extends away from said socket means to define an intermediate portion that overlays one of said conductive pads for soldering said contact element to said one of said conductive pads, said intermediate portion providing an access space for soldering said contact element to said conductive pad and for visually inspecting a resulting solder joint;
 (c) inserting a J-lead surface mount electrical component having a plurality of J-shaped leads into said socket means;
 (d) soldering said plurality of contact elements to said J-shaped leads.

20. A method according to claim 19 wherein said contact elements each have a second portion which is positioned adjacent to a leg portion of a J-shaped lead when said J-lead surface mount electrical component is inserted into said socket means and wherein step (d) comprises soldering said second portions to said leg portions of said J-shaped leads.

21. A method of replacing a J-lead surface mount electrical component on a printed circuit board comprising the steps of:
 (a) removing the J-lead surface mount electrical component to be replaced from the printed circuit board;
 (b) placing a socket means having contact elements on the printed circuit board;
 (c) soldering said contact element to the printed circuit board;
 (d) inserting a replacement J-lead surface mount electrical component in the socket means; and
 (e) soldering the J-leads of the replacement electrical component to said contact elements of said socket means.

22. The method of claim 21 wherein the step (a) includes the sub step of
 applying heat energy to the J-leads of the electrical component such that solder on the J-leads melts.

23. The method of claim 21 wherein the contact elements of the socket means have solder thereon.

* * * * *